United States Patent
Lee (10) Patent No.: US 9,461,221 B2
(45) Date of Patent: *Oct. 4, 2016

(54) LIGHT EMITTING DIODE PACKAGE AND LIGHT SOURCE MODULE AND BACKLIGHT UNIT USING THE SAME

(71) Applicant: LG Display Co., Ltd., Seoul (KR)

(72) Inventor: Dong Hun Lee, Gyeongsangbuk-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/581,474

(22) Filed: Dec. 23, 2014

(65) Prior Publication Data

US 2016/0087175 A1   Mar. 24, 2016

(30) Foreign Application Priority Data

Sep. 23, 2014   (KR) .................. 10-2014-0127149

(51) Int. Cl.
*H01L 33/00*   (2010.01)
*H01L 33/62*   (2010.01)
*H05K 1/18*   (2006.01)
*F21V 8/00*   (2006.01)

(52) U.S. Cl.
CPC ............ *H01L 33/62* (2013.01); *G02B 6/0083* (2013.01); *H05K 1/181* (2013.01); *G02B 6/0068* (2013.01); *G02B 6/0073* (2013.01); *H05K 2201/10106* (2013.01); *H05K 2201/10136* (2013.01); *H05K 2201/10204* (2013.01)

(58) Field of Classification Search
CPC ...................................................... H01L 33/62
USPC ............................................................. 257/99
See application file for complete search history.

(56) References Cited

U.S. PATENT DOCUMENTS

| | | | | |
|---|---|---|---|---|
| 5,373,188 A | * | 12/1994 | Michii | H01L 23/4951 257/666 |
| 6,294,100 B1 | * | 9/2001 | Fan | H01L 21/4832 216/14 |
| 2009/0224268 A1 | * | 9/2009 | Tsuchiya | H01L 33/486 257/88 |
| 2012/0163026 A1 | * | 6/2012 | Jeon | G02B 6/0073 362/612 |

\* cited by examiner

*Primary Examiner* — Andy Huynh
*Assistant Examiner* — Sitaramarao S Yechuri
(74) *Attorney, Agent, or Firm* — Dentons US LLP (57) ABSTRACT

Disclosed is a light emitting diode (LED) package, which can be used for, for example, a light source module, a backlight unit and a display device, that may, for example, include an LED chip in a body portion of the LED package; first and second lead frames separated from each other in the body portion, each of the first and second lead frames including first and second leads that are electrically connected to the LED chip and are used as one of anode and cathode leads; and first and second dummy lead frames separated from each other in the body portion and electrically insulated from the first and second lead frames.

20 Claims, 6 Drawing Sheets

LIGHT EMITTING DIODE PACKAGE AND LIGHT SOURCE MODULE AND BACKLIGHT UNIT USING THE SAME

CROSS-REFERENCE TO RELATED APPLICATIONS

This application claims the benefit of the Korean Patent Application No. 10-2014-0127149, filed on Sep. 23, 2014, which is hereby incorporated by reference for all purposes as if fully set forth herein.

BACKGROUND OF THE INVENTION

1. Field of the Invention

The present invention relates to a light emitting diode package, which can be used for, for example, a light source module, a backlight unit and a display device, and method of manufacturing the same. More particularly, the present invention relates to a light emitting diode package with improved internal wiring and electrode structure.

2. Discussion of the Related Art

In general, liquid crystal display (LCD) devices have various features such as slimness, lightweight and low power consumption. As such, LCD devices are being used in not only monitors, notebooks and mobile phones but also large-sized television receivers.

Such an LCD device typically includes an LCD panel configured to display an image using transmittance of liquid crystal material, and a backlight unit disposed under the LCD panel and configured to apply light to the LCD panel.

The backlight unit includes a light source module configured to emit light toward the LCD panel. The light source module includes a light source. As typical example of the light source, a cold cathode fluorescent lamp (CCFL), a flat fluorescent lamp (FFL), a light emitting diode (LED) and so on are being used.

An ordinary LED package includes first and second lead frames disposed within a body of a mold material, and a single light emitting chip loaded on one of the first and second lead frames. The light emitting chip is electrically connected to one of the first and second lead frames using one of a wire bonding method and a flip chip bonding method.

Such a backlight unit uses a plurality of LED packages that are loaded on a printed circuit board (PCB). The LED packages are serially connected to one another in a chain structure by groups. The LED package chains are connected to one another in parallel and used as a light source module of the backlight unit.

For example, odd-number LED packages of the plurality of LED packages arranged on the PCB are serially connected to one another, and even-number LED packages of the plurality of LED packages are serially connected to one another. Also, a group with the serially connected odd-number LED packages is connected to another group in parallel with the serially connected even-number LED packages. In other words, a light source module with the two chain structure can be used in the backlight unit.

The light source module of the backlight unit including a plurality of LED packages according to the related art has a large number of connection wirings and power supply wirings which are formed on the PCB. Due to this, the PCB may need to have a large width.

To address this matter, a multi-layered connection mode has been proposed in which holes are formed on a PCB, and the connection wirings of the LED packages are formed on the rear surface of the PCB via the holes.

However, the multi-layered connection mode may increase the fabrication cost of the light source module. Moreover, the fabrication procedure of the light source module may become complicated.

SUMMARY OF THE INVENTION

Accordingly, the present invention is directed to provide a light emitting diode package, which can be used for, for example, a light source module, a backlight unit and a display device, and method of manufacturing the same that substantially obviates one or more problems due to limitations and disadvantages of the related art.

An advantage of the present invention is to provide a light emitting diode package with improved internal wiring and electrode structure, which can be used for, for example, a light source module, a backlight unit and a display device.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described, a light emitting diode (LED) package may, for example, include an LED chip in a body portion of the LED package; first and second lead frames separated from each other in the body portion, each of the first and second lead frames including first and second leads that are electrically connected to the LED chip and are used as one of anode and cathode leads; and first and second dummy lead frames separated from each other in the body portion and electrically insulated from the first and second lead frames.

In another aspect of the present invention, a light source module may, for example, include a printed circuit board; and a plurality of light emitting diode (LED) packages arranged on the printed circuit board in a line and connected to one another in a multi-chain structure, each LED package including an LED chip in a body portion, first and second lead frames separated from each other in the body portion, wherein each of the first and second lead frames includes first and second leads that are electrically connected to the LED chip and are used as one of anode and cathode leads, and first and second dummy lead frames separated from each other in the body portion and electrically insulated from the first and second lead frames, wherein the plurality of LED packages in one chain of the multi-chain structure are electrically connected to one another in serial using the first and second dummy lead frames of the LED packages in another chain adjacent thereto.

In yet another aspect of the present invention, a liquid crystal display (LCD) device may, for example, include an LCD panel; a light source module that provides a light toward the LCD panel, the light source module including: a printed circuit board, and a plurality of light emitting diode (LED) packages arranged on the printed circuit board in a line and connected to one another in at least two chains, each LED package including an LED chip in a body portion, first and second lead frames separated from each other in the body portion, each of the first and second lead frames including first and second leads that are electrically connected to the LED chip and are used as one of anode and cathode leads, and first and second dummy lead frames separated from each other in the body portion and electrically insulated from the first and second lead frames; a light guide plate between the light source module and the LCD panel that guides a light emitted from the light source module toward the LCD panel; and a receiving case that receives the light source module and the light guide plate, wherein the plurality of LED packages in one chain of the at least two chains are electrically connected to one another in serial using the first and second dummy lead frames of the LED packages in other chain of the at least two chains adjacent thereto.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

In the following description, numerous specific details are set forth, such as particular structures, sizes, ratios, angles, coefficients and so on, in order to provide an understanding of various embodiments of the present invention. However, one of ordinary skill in the art would appreciate that various embodiments of the present invention can be practiced without these specific details. In other instances, a description of well-known elements and configurations may be omitted.

It should be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof. As used herein, the singular forms "a", "an" and "the" are intended to include the plural forms as well, unless the context clearly indicates otherwise.

In the description of embodiments, when a structure is described as being positioned "on or above" or "under or below" another structure, this description should be construed as including a case in which the structures contact each other as well as a case in which a third structure(s) is disposed therebetween.

The temporal terms of "after", "subsequently", "next", "before" and so on used in this disclosure without specifying "immediately" or "directly" can include other discontinuously temporal relations.

Moreover, although some of the elements are designated with numerical terms (e.g., first, second, third, etc.), it should be understood that such designations are only used to specify one element from a group of similar elements, but not to limit the element in any specific order. As such, an element designated as a first element could be termed as a second element or third element without departing from the scope of exemplary embodiments.

The features of various exemplary embodiments of the present disclosure may be partially or entirely bound or combined with each other, and be technically engaged and driven using various methods as apparent to those skilled in the art, and the exemplary embodiments may be independently practiced alone or in combination.

Reference will now be made in detail to embodiments of the present invention, examples of which are illustrated in the accompanying drawings. Also, the size and thickness of the device may be expressed to be exaggerated for the sake of convenience in the drawings. The same reference numbers may be used throughout the drawings to refer to the same or like parts.

Figure 1:
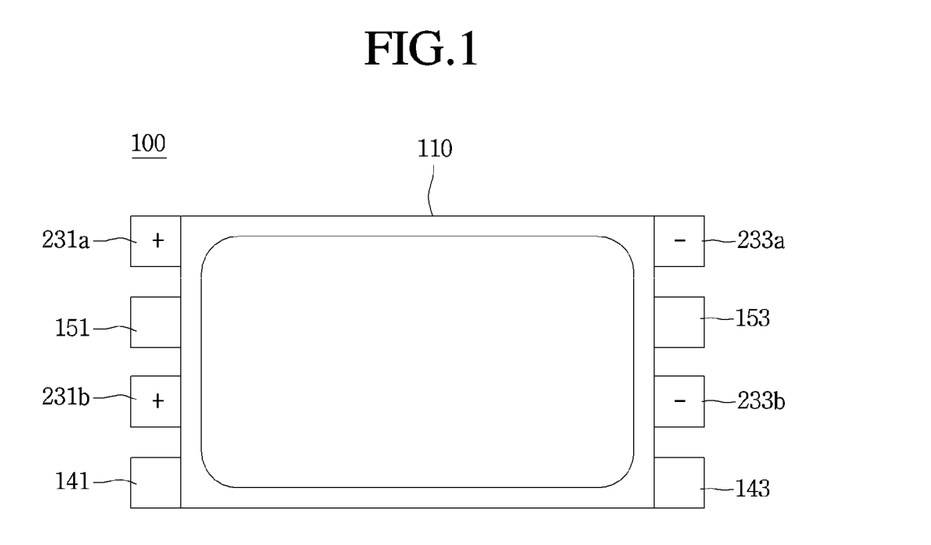
FIG. 1 is a planar view illustrating a schematic structure of an LED package according to the first embodiment of the present invention.
Figure 2:
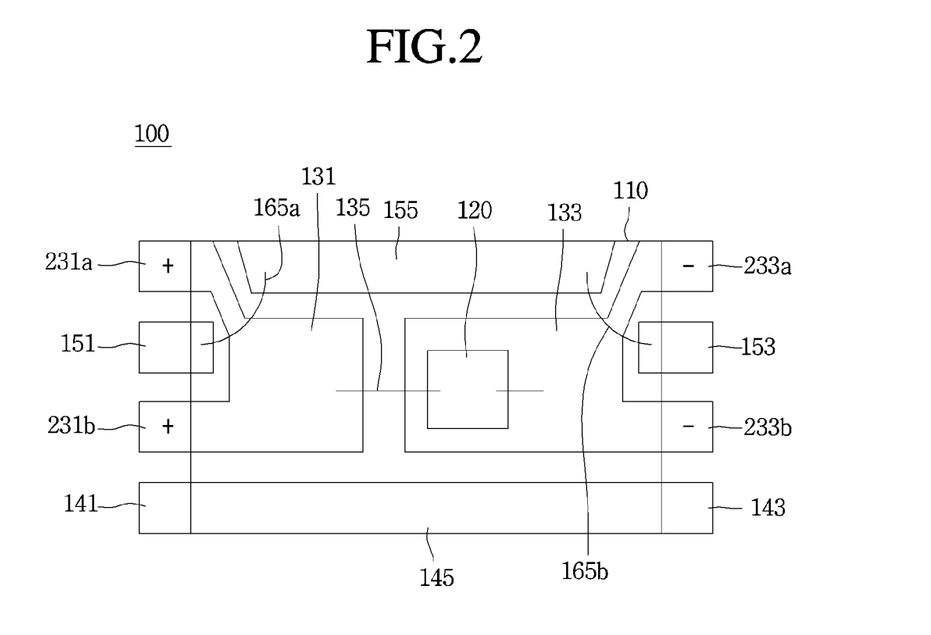
FIG. 2 is a planar view illustrating electrode and wiring structures of the LED package of FIG. 1.
Figure 3:
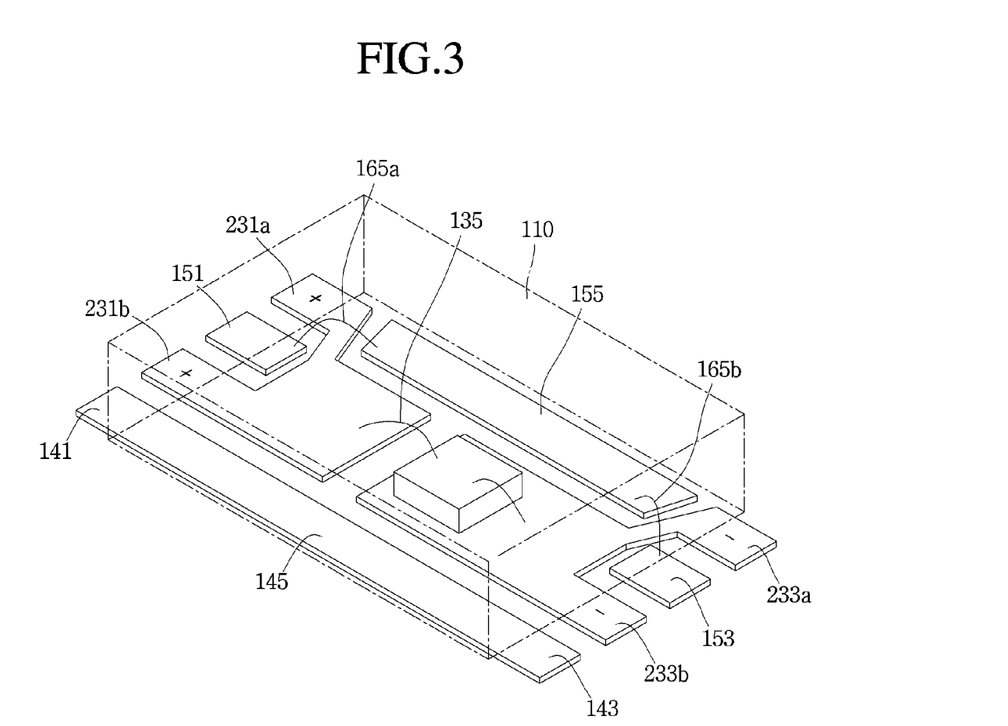
FIG. 3 is a projective and perspective view illustrating the LED package of FIG. 1.

FIG. 1 is a planar view illustrating a schematic structure of an LED package according to the first embodiment of the present invention. FIG. 2 is a planar view illustrating electrode and wiring structures of the LED package of FIG. 1. FIG. 3 is a projective and perspective view illustrating the LED package of FIG. 1.

Referring to FIGS. 1 through 3, an LED package according to the first embodiment of the present invention can include a body portion 110 configured to form a central cavity; first and second lead frames 131 and 133 and first and second dummy lead frames 155 and 145 which are formed inside the body portion 110; and a LED chip 120 loaded on the second lead frame 133.

The body portion 110 can be formed in an upper-surface-opened case shape with a cross-section of 'U'. As such, the body portion 110 can have a receiving space suitable to receive the first and second lead frames 131 and 133, the first and second dummy lead frames 155 and 145 and the LED chip 120. In order to insulate and protect the received components, the body portion 110 can be formed from an insulation material such as polymer, ceramic or other.

Also, the receiving space of the body portion 110 can be filled with a sealant (not shown) such as a transparent resin or others. The sealant filled in the inside of the body portion 110 can be used to diffuse light emitted from the LED chip 120.

Moreover, inner side surfaces of the body portion 110 can be coated with a reflective material (not shown).

The first lead frame 131 can include first and second anode leads 231a and 231b, and the second lead frame 133 can include first and second cathode leads 233a and 233b. The first and second anode leads 231a and 231b of the first lead frame 131 and the first and second cathode leads 233a and 233b of the second lead frame 133 can be arranged opposite to each other in both sides (or edges) of the body portion 110. Also, the first and second anode leads 231a and 231b and the first and second cathode leads 233a and 233b can be separated from each other in the inside of the body portion 110. As such, the first and second anode leads 231a and 231b and the first and second cathode leads 233a and 233b can be electrically insulated from each other.

End portions of the first and second anode leads 231a and 231b and end portions of the first and second cathode leads 233a and 233b can be exposed to the outside of the body portion 110. For example, the end portions of the first and second anode leads 231a and 231b can outwardly protrude from one of two side walls of the body portion 110 opposite to each other. The end portions of the first and second cathode leads 233a and 233b can outwardly protrude from the other side wall of the body portion 110.

The first and second anode leads 231a and 231b can be formed in a single body united with the first lead frame 131. The first and second cathode leads 233a and 233b can be formed in a single body united with the second lead frame 133.

The LED chip 120 is mounted on the second lead frame 133. The LED chip 120 is electrically connected to the first and second lead frames 131 and 133 through first wires 135.

For example, a p-type electrode (an anode terminal) of the LED chip 120 can be connected to the first lead frame 131 through one of the first wires 135. Also, an n-type electrode (a cathode terminal) of the LED chip 120 can be connected to the second lead frame 133 through the other one of the first wires 135.

Also, the LED chip 120 can be mounted on the second lead frame 133 in a die bonding mode using conductive epoxy, but it is not limited to this. For example, the LED chip 120 can be mounted on the first lead frame 131.

Although it is not illustrated in detail in the drawings, the LED chip 120 can include n-type and p-type semiconductor layers, an emission layer interposed between the two semiconductor layers, an n-type electrode connected to the n-type semiconductor layer, and a p-type electrode connected to the p-type semiconductor layer.

In detail, the LED chip 120 can allow an n-GaN/AlGaN-based semiconductor layer doped with an n-type semiconductor impurity to be formed on a transparent substrate (not shown). The transparent substrate can be formed from one of a sapphire, gallium nitride GaN, silicon carbide and so on. The n-type semiconductor impurity can be one of silicon Si, germanium Ge and tin Sn.

An emission layer can be formed on the n-type semiconductor layer. The emission layer can be formed from a GaN-based material. Also, the emission layer can be formed in one of a single quantum well (SQW) structure and a multi quantum well (MQW) structure.

Subsequently, a p-GaN/AlGaN-based semiconductor layer doped with a p-type semiconductor impurity can be formed on the emission layer. The p-type semiconductor impurity can be magnesium Mg.

Thereafter, the p-type semiconductor layer and the emission layer are sequentially etched in order to expose a part of the n-type semiconductor layer. An n-type electrode is formed on the exposed portion of the n-type semiconductor layer. Also, a p-type electrode can be formed on the remaining p-type semiconductor layer.

The LED chip 120 with the above-mentioned configuration enables electrons and holes to be drifted from the n-type semiconductor layer and the p-type semiconductor layer to the emission layer, when an electrical field is externally applied between the n-type electrode and the p-type electrode. An energy generated by the recombination of the electrons and the holes within the emission layer is converted into light. Light generated in the emission is emitted to the exterior.

The first and second dummy lead frames 155 and 145 are arranged in such a manner as to be separated from the first lead frames 131 and 133. As such, the first and second dummy lead frames 155 and 145 can be electrically insulated from the first and second lead frames 131 and 133. The first dummy lead frame 155 is formed without being exposed to the outside of the body portion 110. The second dummy lead frame 145 is formed in a single body united with second and fourth dummy leads 141 and 143, each of which protrudes in an outward direction of the body portion 110.

Also, first and third dummy leads 151 and 153 are disposed at both outer side walls of the body portion 110 of the LED package 100. The first and third dummy leads 151 and 153 are electrically connected to the first dummy lead frame 155 b, which is formed in the inside of the body portion 110 through second and third wires 165a and 165b.

In other words, the first and second anode leads 231a and 231b and the first and second dummy leads 151 and 141 are arranged in one of both side wells of the body portion 110 opposite to each other in such a manner as to protrude in an outward direction. Also, the first and second cathode leads 233a and 233b and the third and fourth dummy leads 153 and 143 are arranged in the other side well of the body portion 110 in such a manner as to protrude in another outward direction.

The first dummy lead 151, the first dummy frame 155 and the third dummy lead 153 can be used as a connective path which penetrates through the inside of the respective LED package and is connected to, for example, two other LED packages adjacent to the respective LED package without being electrically connected to the LED chip 120 within the respective LED package.

Similarly, the second dummy lead 141, the second dummy frame 145 and the fourth dummy lead 143 formed in a single body united with one another can be used as another connective path which penetrates through the respective LED package.

In this manner, the LED package according to an embodiment of the present invention can provide connective paths penetrating through its inside without forming any connection wiring in its outside. As such, the number of wirings which will be formed on the PCB can be reduced.

In other words, the LED package 100 of this embodiment provides the dummy lead frames 155 and 145 used as connective paths and forms end leads of the lead frames 131 and 133 in a double lead structure with the first and second anode lead 231a and 231b and the first and second cathode leads 233a and 233b. In accordance therewith, when a plurality of LED packages 100 are loaded on a PCB of a light source module which will be described later, not only can the number of wirings formed on the PCB be reduced, but also the length of the wiring can be shortened.

Also, the LED package together with adjacent LED packages thereto can be connected in chains without forming multi-layered wirings on the rear surface of the PCB. Therefore, not only can the fabrication cost of the light source module be reduced, but also the fabrication procedure of the light source module can be simplified.

Moreover, the LED package including the dummy lead frames, which are used as connective paths, can decrease the number of wirings exposed outside the LED package. In accordance therewith, the width of the PCB can be reduced.

Figure 4:
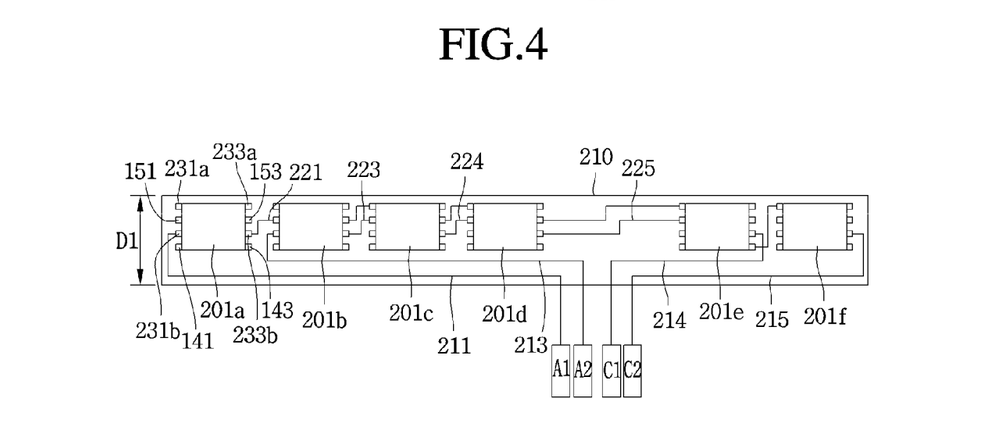
FIG. 4 is a circuit diagram illustrating LED packages connected in a double-chain structure according to the first embodiment of the present invention.
Figure 5:
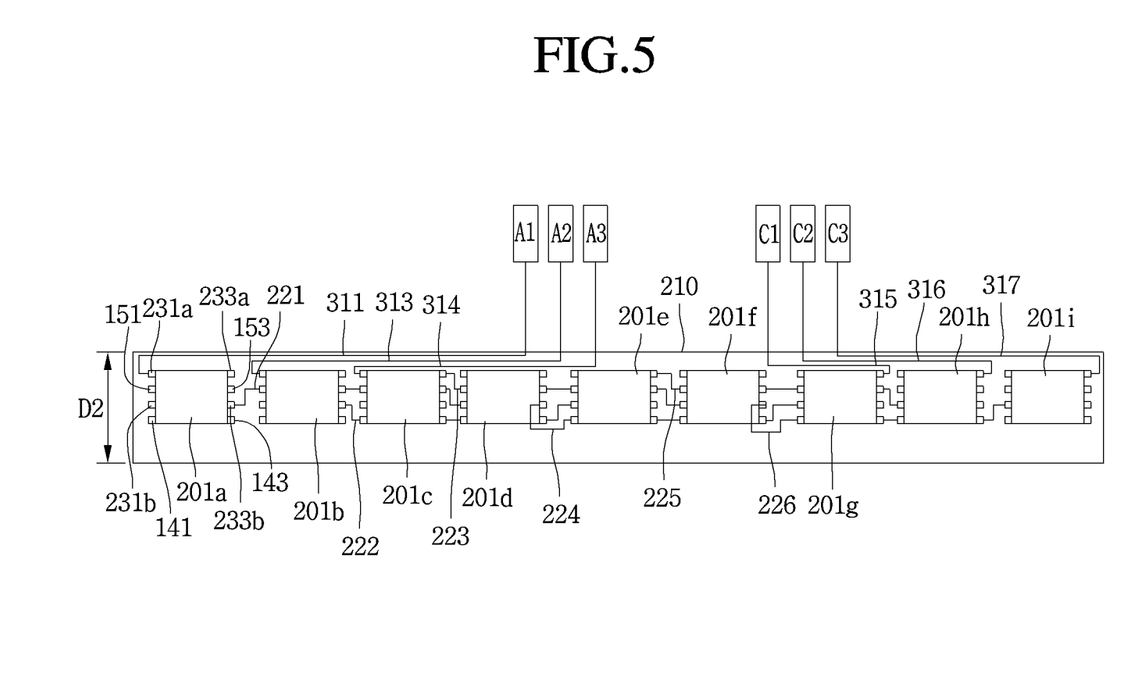
FIG. 5 is a circuit diagram illustrating LED packages connected in a triple-chain structure according to the first embodiment of the present invention.

FIG. 4 is a circuit diagram illustrating a plurality of LED packages connected in a double-chain structure according to the first embodiment of the present invention. FIG. 5 is a circuit diagram illustrating a plurality of LED packages connected in a triple-chain structure according to the first embodiment of the present invention.

Referring to FIGS. 1 through 4, first through sixth LED packages 201a, 201b, 201c, 201d, 201e and 201f are mounted on a PCB 210 in a single line.

In the first LED package 201 as an example, first and second anode leads 231a and 231b and first and second dummy leads 151 and 141 arranged in one of both side walls of the first LED package 201 opposite to each other are externally exposed. Also, first and second cathode leads 233a and 233b and third and fourth dummy leads 153 and 143 arranged in the other side wall of the first LED package 201a are externally exposed.

The second through sixth LED packages 201b, 201c, 201d, 201e and 201f are formed in the same structure as the first LED package 201a.

Also, first through fourth power supply wirings 211, 213, 214 and 215 are arranged in the PCB 210. The first and third power supply wirings 211 and 214 are serially connected with the first, third and fifth LED packages 201a, 201c and 201e, thereby forming a first LED package chain.

On the other hand, the second and fourth power supply wirings 213 and 215 are serially connected with the second, fourth and sixth LED packages 201b, 201d and 201f, thereby forming a second LED package chain.

In detail, the first power supply wiring 211 is connected to the second anode lead 231b protruding from one side wall edge of the first LED package 201a. The second cathode lead 133b protruding from the other side wall is electrically connected to the first anode lead 231a of the third LED package 201c through a first connective wiring 221 that passes through the first connective path of the second LED package 201b between the first and third LED packages 201a and 201c.

The first connective path of the second LED package 201b includes the first dummy lead 151, the first dummy lead frame 155 and the third dummy lead 153 connected one another, as illustrated in FIGS. 1 through 3. As such, the first connective wiring 221 can penetrate through the second LED package 201 and connect the second cathode lead 233b of the first LED package 201a and the first anode lead 231a of third LED package 201c to each other, without any electrical connection with the LED chip 120 of the second LED package 201b.

Such a first connective wiring 221 can include the first connective path of the second LED package 201b, a wire that connects the second cathode lead 233b of the other side wall of the first LED package 201a to the first dummy lead 151 of the second LED package 201b adjacent thereto, and another wire that connects the third dummy lead 153 of the second LED package 201b to the first anode lead 231a of the third LED package 201c adjacent thereto.

The second cathode lead 133b protruding from the other side wall of the third LED package 201c is electrically connected to the first anode lead 231a of the fifth LED package 201e through a third connective wiring 224 that passes through the first connective path of the fourth LED package 201d between the third and fifth LED packages 201c and 201e. The first connective path of the fourth LED package 201d is configured with the first dummy lead 151, the first dummy frame 155 and the third dummy lead 153 of the fourth LED package 201d. The third connective wiring 224 can include the first connective path of the fourth LED package 201d, a wire that connects the second cathode lead 233b of the other side wall of the third LED package 201c to the first dummy lead 151 of the fourth LED package 201d adjacent thereto, and another wire that connects the third dummy lead 153 of the fourth LED package 201d to the first anode lead 231a of the fifth LED package 201e adjacent thereto, similar to the first connective wiring 221.

The second cathode lead 233b of the fifth LED package 201e is connected to the third power supply wiring 214. In accordance therewith, the first LED package chain can be completed.

In the same manner, the second LED package chain, which is configured with the second, fourth and sixth LED packages 201b, 201d and 201f serially connected between the second and fourth power supply wirings 213 and 215, can be formed using second and fourth connective wirings 223 and 225.

The second power supply wiring 213 is connected to the second anode lead 231b protruding from one side wall of the second LED package 201b. The fourth power supply wiring 215 is connected to the second cathode lead 233b protruding from the other side wall of the sixth LED package 201f.

The second connective wiring 223 can include the first connective path of the third LED package 201c, a wire that connects the second cathode lead 233b of the other side wall of the second LED package 201b to the first dummy lead 151 of the third LED package 201c adjacent thereto, and another wire that connects the third dummy lead 153 of the third LED package 201c to the first anode lead 231a of the fourth LED package 201d adjacent thereto. The fourth connective wiring 225 can include the first connective path of the fifth LED package 201e, a wire that connects the second cathode lead 233b of the other side wall of the fourth LED package 201d to the first dummy lead 151 of the fifth LED package 201e adjacent thereto, and another wire that connects the third dummy lead 153 of the fifth LED package 201e to the first anode lead 231a of the sixth LED package 201f adjacent thereto.

In this way, the LED package 201 provides the dummy lead frames 155 and 145 used as connective paths and forms end leads of the lead frames 131 and 133 in a double-lead structure with the first and second anode lead 231a and 231b and the first and second cathode leads 233a and 233b. In accordance therewith, when a plurality of LED packages 201 are loaded on a PCB 210 of a light source module, not only can the number of wirings formed on the PCB 210 be reduced, but also the length of the wiring formed on the PCB 210 can be shortened. Moreover, even with a large number of LED packages, the width D1 of the PCB 210 can be reduced.

Referring to FIGS. 1 through 3 and 5, first through ninth LED packages 201a, 201b, 201c, 201d, 201e, 201f, 201g, 201h and 201i in accordance with the first embodiment of the present disclosure are mounted on a PCB 210 in a single line.

The nine LED packages 201a through 201i can be connected with one another in a triple-chain structure. In this case, a first LED package chain can include the first, fourth and seventh LED packages 201a, 201d and 201g connected to one another. A second LED package chain can include the second, fifth and eighth LED packages 201b, 201e and 201h connected to one another. A third LED package chain can include the third, sixth and ninth LED packages 201c, 201f and 201i connected to one another.

As described above, the first LED package 201 allows first and second anode leads 231a and 231b and first and second dummy leads 151 and 141 arranged in one of both side walls of the first LED package 201 opposite to each other to be externally exposed. Also, first and second cathode leads 233a and 233b and third and fourth dummy leads 153 and 143 arranged in the other side wall of the first LED package 201a are externally exposed. Moreover, the first dummy lead 151, the first dummy lead frame 155 and the third dummy lead 153 can form a first connective path of the first LED package 201 which is used for connecting two LED packages adjacent thereto without any electrical connection with the LED chip 120 of the first LED package 201a. Furthermore, the second dummy lead 141, the second dummy lead frame 145 and the fourth dummy lead 143 can form a second connective path of the first LED package 201a which is used to for connecting two LED packages adjacent thereto without any electrical connection with the LED chip 120 of the first LED package 201a.

The second through ninth LED packages 201b, 201c, 201d, 201e, 201f, 201g, 201h and 201i are formed in the same structure as the first LED package 201a.

First through sixth power supply wirings 311, 313, 314, 315, 316 and 317 are arranged in the PCB 210. Also, first through sixth connective wirings 221 through 226 using one of the first and second connective paths of each LED package 201 can be formed on the PCB 210.

The first LED package chain allows the first, fourth and seventh LED packages 201a, 201d and 201g to be serially connected between first and fourth power supply wirings 311 and 315 using the first and fourth connective wirings 221 and 224.

The first power supply wiring 311 is connected to the first anode lead 231a of the first LED package 201a. The fourth power supply wiring 315 is connected to the first cathode lead 233a of the seventh LED package 201g.

The first connective wiring 221 is connected between the second cathode lead 233b of the first LED package 201a and the second anode lead 231b of the fourth LED package 201d via the first connective paths of the second and third LED packages 201b and 201c. In exception of the first connective paths of the second and third LED packages 201b and 201c, the first connective wiring 221 includes one wire connected between the second cathode lead 233b of the first LED package 201a and the first dummy lead 151 of the second LED package 201b, another wire connected between the third dummy lead 153 of the second LED package 201b and the first dummy lead 151 of the third LED package 201c, and still another wire connected between the third dummy lead 153 of the third LED package 201c and the second anode lead 231b of the fourth LED package 201d.

The fourth connective wiring 224 is connected between the second cathode lead 233b of the fourth LED package 201d and the second anode lead 231b of the seventh LED package 201g via the second connective paths of the fifth and sixth LED packages 201e and 201f. In exception of the second connective paths of the fifth and sixth LED packages 201e and 201f, the fourth connective wiring 224 includes one wire connected between the second cathode lead 233b of the fourth LED package 201d and the second dummy lead 141 of the fifth LED package 201e, another wire connected between the fourth dummy lead 143 of the fifth LED package 201e and the second dummy lead 141 of the sixth LED package 201f, and still another wire connected between the fourth dummy lead 143 of the sixth LED package 201f and the second anode lead 231b of the seventh LED package 201g.

Also, the second LED package chain allows the second, fifth and eighth LED packages 201b, 201e and 201h to be serially connected between second and fifth power supply wirings 313 and 316 using the second and fifth connective wirings 222 and 225.

The second power supply wiring 313 is connected to the first anode lead 231a of the second LED package 201b. The fifth power supply wiring 316 is connected to the first cathode lead 233a of the eighth LED package 201h.

The second connective wiring 222 is connected between the second cathode lead 233b of the second LED package 201b and the second anode lead 231b of the fifth LED package 201e via the second connective paths of the third and fourth LED packages 201c and 201d. In exception of the second connective paths of the third and fourth LED packages 201c and 201d, the second connective wiring 222 includes one wire connected between the second cathode lead 233b of the second LED package 201b and the second dummy lead 141 of the third LED package 201c, another wire connected between the fourth dummy lead 143 of the third LED package 201c and the second dummy lead 141 of the fourth LED package 201d, and still another wire connected between the fourth dummy lead 143 of the fourth LED package 201d and the second anode lead 231b of the fifth LED package 201e.

The fifth connective wiring 225 is connected between the first cathode lead 233a of the fifth LED package 201e and the second anode lead 231b of the eighth LED package 201h via the first connective paths of the sixth and seventh LED packages 201f and 201g. In exception of the first connective paths of the sixth and seventh LED packages 201f and 201g, the fifth connective wiring 225 includes one wire connected between the first cathode lead 233a of the fifth LED package 201e and the first dummy lead 151 of the sixth LED package 201f, another wire connected between the third dummy lead 153 of the sixth LED package 201f and the first dummy lead 151 of the seventh LED package 201g, and still another wire connected between the third dummy lead 153 of the seventh LED package 201g and the second anode lead 231b of the eighth LED package 201h.

Moreover, the third LED package chain allows the third, sixth and ninth LED packages 201c, 201f and 201i to be serially connected between third and sixth power supply wirings 314 and 317 using the third and sixth connective wirings 223 and 226.

The third power supply wiring 314 is connected to the first anode lead 231a of the third LED package 201c. The sixth power supply wiring 317 is connected to the first cathode lead 233a of the ninth LED package 201i.

The third connective wiring 223 is connected between the first cathode lead 233a of the third LED package 201c and the second anode lead 231b of the sixth LED package 201f via the first connective paths of the fourth and fifth LED packages 201d and 201e. In exception of the first connective paths of the fourth and fifth LED packages 201d and 201e, the third connective wiring 223 includes one wire connected between the first cathode lead 233a of the third LED package 201c and the first dummy lead 151 of the fourth LED package 201d, another wire connected between the third dummy lead 153 of the fourth LED package 201d and the first dummy lead 151 of the fifth LED package 201e, and still another wire connected between the third dummy lead 153 of the fifth LED package 201e and the second anode lead 231b of the sixth LED package 201f.

The sixth connective wiring 226 is connected between the second cathode lead 233b of the sixth LED package 201e and the second anode lead 231b of the ninth LED package 201*i* via the second connective paths of the seventh and eighth LED packages 201*g* and 201*h*. In the exception of the second connective paths of the seventh and eighth LED packages 201*g* and 201*h*, the sixth connective wiring 226 includes one wire connected between the second cathode lead 233*b* of the sixth LED package 201*f* and the second dummy lead 141 of the seventh LED package 201*g*, another wire connected between the fourth dummy lead 143 of the seventh LED package 201*g* and the second dummy lead 141 of the eighth LED package 201*h*, and still another wire connected between the fourth dummy lead 143 of the eighth LED package 201*h* and the second anode lead 231*b* of the ninth LED package 201*i*.

Even when the number of LED packages 201 loaded on a PCB 210 of a light source module increases, not only can the number of wirings formed on the PCB 210 be reduced or minimized, but also the length of the wiring formed on the PCB 210 can be reduced, as illustrated in FIG. 5. This is because the LED package 201 provides the dummy lead frames 155 and 145 used as connective paths and forms end leads of the lead frames 131 and 133 in a double-lead structure with the first and second anode lead 231*a* and 231*b* and the first and second cathode leads 233*a* and 233*b*. Moreover, the PCB 210 of FIG. 5 loaded with the larger number of LED packages compared to those of FIG. 4 can be formed in a narrow width D2.

Figure 6:
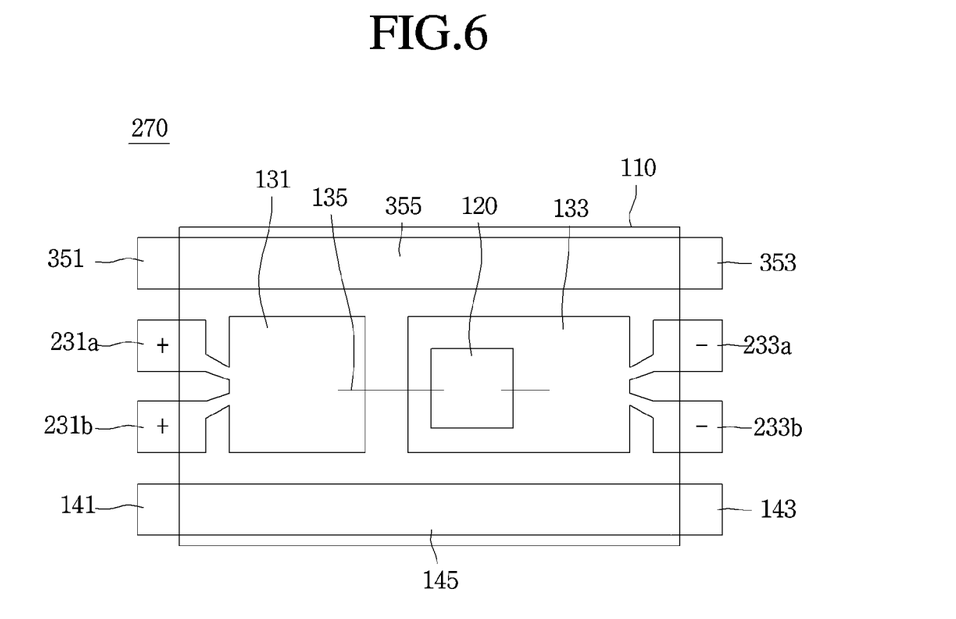
FIG. 6 is a planar view illustrating a structure of an LED package according to the second embodiment of the present invention.
Figure 7:
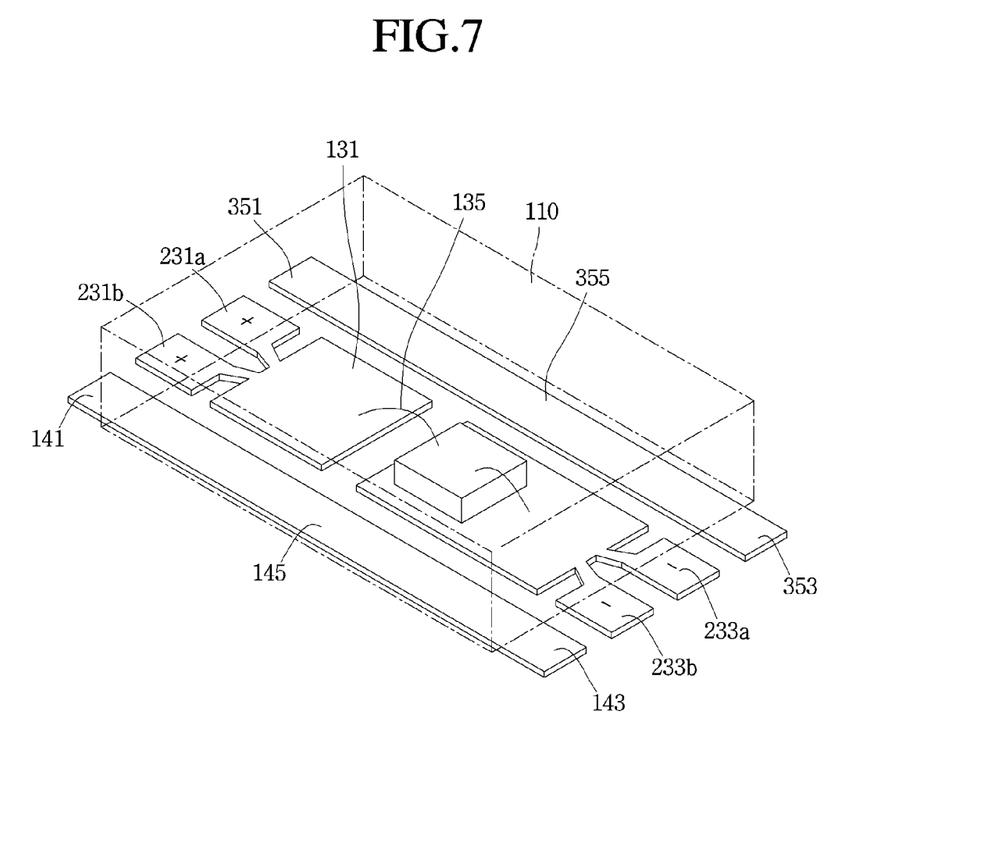
FIG. 7 is a projective and perspective view illustrating the LED package of FIG. 6.

FIG. 6 is a planar view illustrating a structure of an LED package according to the second embodiment of the present invention. FIG. 7 is a projective and perspective view illustrating the LED package of FIG. 6.

Referring to FIGS. 6 and 7, an LED package according to the second embodiment of the present invention can include a body portion 110 configured to form a central cavity; first and second lead frames 131 and 133 and first and second dummy lead frames 355 and 145 which are formed inside the body portion 110; and a LED chip 120 loaded on the second lead frame 133.

The body portion 110 can be formed in an upper-surface-opened case shape with a cross-section of 'U'. As such, the body portion 110 can be provided with a receiving space suitable to receive the first and second lead frames 131 and 133, the first and second dummy lead frames 355 and 145 and the LED chip 120.

The first lead frame 131 can include first and second anode leads 231*a* and 231*b*, and the second lead frame 133 can include first and second cathode leads 233*a* and 233*b*. The first and second anode leads 231*a* and 231*b* of the first lead frame 131 and the first and second cathode leads 233*a* and 233*b* of the second lead frame 133 can be arranged opposite to each other in both sides (or edges) of the body portion 110.

The first and second dummy lead frames 355 and 145 are arranged in such a manner as to be separated from the first lead frames 131 and 133. As such, the first and second dummy lead frames 355 and 145 can be electrically insulated from the first and second lead frames 131 and 133.

The first dummy lead frame 355 can include first and second dummy leads 351 and 353, each of which protrudes in an outward direction of the body portion 110. Also, the first dummy lead frame 355 and the first and third dummy leads 351 and 353 can be formed in a single body united with one another.

The second dummy lead frame 145 is formed in a single body united with second and fourth dummy leads 141 and 143, each of which protrudes in an outward direction of the body portion 110.

In other words, the first and second anode leads 231*a* and 231*b* and the first and second dummy leads 351 and 141 are arranged in one of both side wells of the body portion 110 opposite to each other in such a manner as to protrude in an outward direction. Also, the first and second cathode leads 233*a* and 233*b* and the third and fourth dummy leads 353 and 143 are arranged in the other side well of the body portion 110 in such a manner as to protrude in another outward direction.

The first dummy lead 351, the first dummy frame 355 and the third dummy lead 353 can be used as an additional connective path that passes through the inside of the respective LED package and is connected to, for example, two other LED packages adjacent to the respective LED package without being electrically connected to the LED chip 120 within the respective LED package.

Similarly, the second dummy lead 141, the second dummy lead frame 145 and the fourth dummy lead 143 can be used as another additional connective path passing through the respective LED package.

In this manner, the LED package according can provide additional wirings passing through its inside without forming any connection wiring in its outside. As such, the number of wirings on the PCB can be reduced.

Also, the LED package according to the second embodiment of the present disclosure together with adjacent LED packages thereto can be connected in chains without forming multi-layered wirings on the rear surface of the PCB. Therefore, not only can the fabrication cost of the light source module be reduced, but also the fabrication procedure of the light source module can be simplified.

Figure 8:
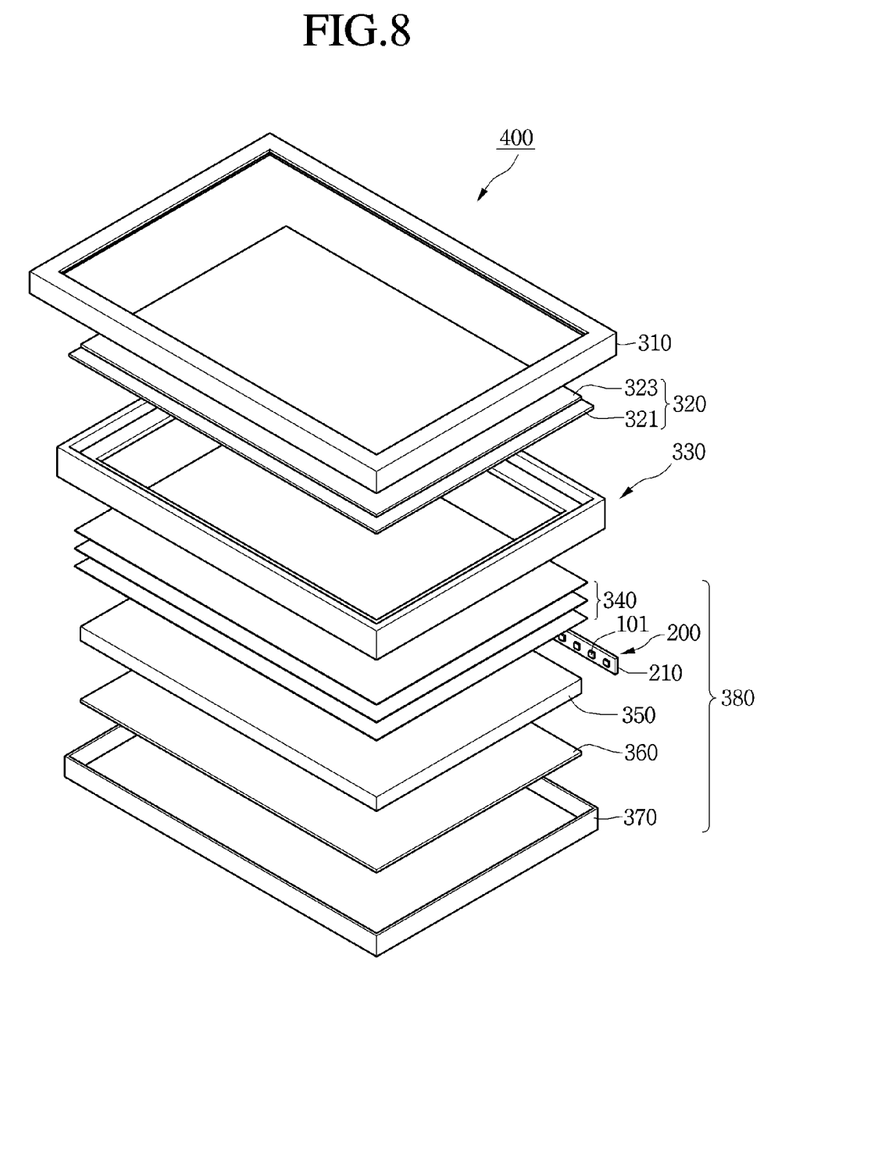
FIG. 8 is an exploded perspective view illustrating an LCD device using a light source module according to an embodiment of the present invention.

FIG. 8 is an exploded perspective view illustrating an LCD device using a light source module according to an embodiment of the present invention.

Referring to FIG. 8, an LCD device 400 can include a top cover 310, an LCD panel 320 and a backlight unit 380.

The top cover 310 is disposed on the LCD panel 320. Also, the top cover 310 can protect the LCD panel 310 from an external impact. A window is formed in the top cover 310. The window of the top cover 310 exposes a display area of the LCD panel 320.

The LCD panel 320 can include an array substrate 321, a color filter substrate 323 opposite to the array substrate 321, and a liquid crystal layer (not shown) interposed between the two substrates 321 and 323.

The backlight unit 380 is disposed under the LCD panel 320. Also, the backlight unit 380 can apply light to the LCD panel 320.

Such a backlight unit 380 can include a light source module 200, a light guide plate 350, optical sheets 340, a reflective sheet 360 and a bottom cover 370.

The light source module 200 includes a plurality of LED packages 101 each configured to emit light, and a PCB 210 loaded with the LED packages 101. In detail, the light source module 200 can have the same configuration as those described in FIGS. 4 and 5 using the LED packages in accordance with the first and second embodiments of the present invention.

Such a light source module 200 is disposed one side surface of the light guide plate 350. Also, the light source module 200 can be disposed on an inner side surface of the bottom cover 370.

The light source plate 350 is disposed adjacently to the light source module 200. Such a light guide plate 350 can guide light emitted from the light source module 200 toward the LCD panel.

The optical sheets 340 can be stacked on the light guide plate 350. Also, the optical sheets 340 can enhance an efficiency of light that is applied from the light guide plate 350 to the LCD panel 320. Such optical sheets can include a diffusive sheet, a prism sheet and a protective sheet.

The reflective sheet 360 is disposed under the light guide plate 350. Such a reflective sheet 360 can reflects light leaking from the lower surface of the light guide plate 350 toward the light guide plate 350.

The bottom cover 370 is configured with a single bottom plane and side walls. As such, the reflective sheet 360, the light guide plate 350, the light source module 200 and the optical sheets 340 can be received within the bottom cover 370.

The backlight unit 380 can further include a guide panel 330. The guide panel 330 is interposed between the LCD panel 320 and the optical sheets 340. Such a guide panel 330 together with the bottom cover 370 can support the LCD panel 320. Also, the guide panel 330 can fix the reflective sheet, the light guide plate 350 and the optical sheets 340 to the bottom cover 370.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode (LED) package comprising:
an LED chip in a body portion of the LED package;
first and second lead frames separated from each other in the body portion, provided in first and second sides of the LED package, respectively, facing each other with the body portion therebetween, each of the first and second lead frames including first and second leads that are electrically connected to the LED chip, and are used as one of anode and cathode leads; and
first and second dummy lead frames running from the first side to the second side, with the first and second lead frames and the LED chip therebetween, and separated from each other in the body portion and electrically insulated from the first and second lead frames;
first and second dummy leads provided in the first and second sides of the LED package, respectively, and electrically connected to the first dummy lead frame, facing each other with the body portion therebetween; and
third and fourth dummy leads provided in the first and second sides of the LED package, respectively, and electrically connected to the second dummy lead frame, facing each other with the body portion therebetween,
wherein at least one of the first and second leads of the first lead frame is provided between the first and third dummy leads in the first side, and at least one of the first and second leads of the second lead frame is provided between the second and fourth dummy leads in the second side.

2. The LED package of claim 1, wherein the first and second dummy leads are separated from the first dummy lead frame and electrically connected to the first dummy lead frame by wires.

3. The LED package of claim 2, wherein the third and fourth dummy leads protrude in outward directions from the body portion.

4. The LED package of claim 3, wherein the second dummy lead frame and the third and fourth dummy leads are formed in a single body united with each other.

5. The LED package of claim 1, wherein the first and second leads of the first lead frame are used as first and second anode leads.

6. The LED package of claim 5, wherein the first and second anode leads and the first lead frame are formed in a single body united with one another.

7. The LED package of claim 1, wherein the first and second leads of the second lead frame are used as first and second cathode leads.

8. The LED package of claim 7, wherein the first and second cathode leads and the second lead frame are formed in a single body united with one another.

9. A light source module comprising:
a printed circuit board; and
a plurality of light emitting diode (LED) packages arranged on the printed circuit board in a line and connected to one another in a multi-chain structure, each LED package including:
an LED chip in a body portion,
first and second lead frames separated from each other in the body portion, provided in first and second sides of the LED package, respectively, facing each other with the body portion therebetween, wherein each of the first and second lead frames includes first and second leads that are electrically connected to the LED chip, and are used as one of anode and cathode leads, and
first and second dummy lead frames running from the first side to the second side, with the first and second lead frames and the LED chip therebetween, and separated from each other in the body portion and electrically insulated from the first and second lead frames,
first and second dummy leads provided in the first and second sides of the LED package, respectively, and electrically connected to the first dummy lead frame, facing each other with the body portion therebetween; and
third and fourth dummy leads provided in the first and second sides of the LED package, respectively, and electrically connected to the second dummy lead frame, facing each other with the body portion therebetween,
wherein at least one of the first and second leads of the first lead frame is provided between the first and third dummy leads in the first side, and at least one of the first and second leads of the second lead frame is provided between the second and fourth dummy leads in the second side, and
wherein the plurality of LED packages in one chain of the multi-chain structure are electrically connected to one another in serial using the first and second dummy lead frames of the LED packages in another chain adjacent thereto.

10. The light source module of claim 9, wherein the first and second dummy leads are separated from the first dummy lead frame and connected to the first dummy lead frame by wires.

11. The light source module of claim 10, wherein the third and fourth dummy leads protrude in outward directions from the body portion.

12. The light source module of claim 11, wherein the second dummy lead frame and the third and fourth dummy leads are formed in a single body united with each other.

13. The light source module of claim 9, wherein the first and second leads of the first lead frame are used as first and second anode leads.

14. The light source module of claim 13, wherein the first and second anode leads and the first lead frame are formed in a single body united with one another.

15. The light source module of claim 9, wherein the first and second leads of the second lead frame are used as first and second cathode leads.

16. The light source module of claim 15, wherein the first and second cathode leads and the second lead frame are formed in a single body united with one another.

17. A liquid crystal display (LCD) device, including a backlight unit comprising:
   an LCD panel;
   a light source module that provides a light toward the LCD panel, the light source module including:
   a printed circuit board, and
   a plurality of light emitting diode (LED) packages arranged on the printed circuit board in a line and connected to one another in at least two chains, each LED package including:
      an LED chip in a body portion, first and second lead frames separated from each other in the body portion, provided in first and second sides of the LED package, respectively, facing each other with the body portion therebetween, each of the first and second lead frames including first and second leads that are electrically connected to the LED chip, and are used as one of anode and cathode leads,
      first and second dummy lead frames running from the first side to the second side, with the first and second lead frames and the LED chip therebetween, and separated from each other in the body portion and electrically insulated from the first and second lead frames,
      first and second dummy leads provided in the first and second sides of the LED package, respectively, and electrically connected to the first dummy lead frame and facing each other with the body portion therebetween, and
      third and fourth dummy leads provided in the first and second sides of the LED package, respectively, and electrically connected to the second dummy lead frame and facing each other with the body portion therebetween,
      wherein at least one of the first and second leads of the first lead frame is provided between the first and third dummy leads in the first side, and at least one of the first and second leads of the second lead frame is provided between the second and fourth dummy leads in the second side;
   a light guide plate between the light source module and the LCD panel that guides a light emitted from the light source module toward the LCD panel; and
   a receiving case that receives the light source module and the light guide plate,
   wherein the plurality of LED packages in one chain of the at least two chains are electrically connected to one another in serial using the first and second dummy lead frames of the LED packages in the other chain of the at least two chains adjacent thereto.

18. The LCD of claim 17, wherein the first and second dummy leads are separated from the first dummy lead frame and electrically connected to the first dummy lead frame by wires.

19. The LCD of claim 18, wherein the third and fourth dummy leads protrude in outward directions from the body portion.

20. The LCD of claim 19, wherein the second dummy lead frame and the third and fourth dummy leads are formed in a single body united with each other.

* * * * *